United States Patent [19]
Fujii

[11] Patent Number: 5,449,932
[45] Date of Patent: Sep. 12, 1995

[54] FIELD EFFECT TRANSISTOR HAVING GATE AND SOURCE REGIONS IN RECESSES

[75] Inventor: Takayuki Fujii, Itami, Japan

[73] Assignee: Mitsubishi Denki Kabushiki Kaisha, Tokyo, Japan

[21] Appl. No.: 208,837

[22] Filed: Mar. 11, 1994

[30] Foreign Application Priority Data

May 26, 1993 [JP] Japan .................... 5-123750

[51] Int. Cl.6 .............. H01L 29/48; H01L 29/56; H01L 29/64
[52] U.S. Cl. ................. 257/284; 257/282; 257/496; 257/618
[58] Field of Search ............ 257/283, 282, 284, 287, 257/496, 618, 331, 332, 333, 334, 401, 920, 275, 276, 622

[56] References Cited

U.S. PATENT DOCUMENTS

| | | | |
|---|---|---|---|
| 4,893,155 | 1/1990 | Ohata | 257/618 |
| 4,984,036 | 1/1991 | Sakamoto et al. | 257/284 |
| 5,185,534 | 2/1993 | Sakamoto et al. | 257/287 |
| 5,321,291 | 6/1994 | Redwine | 257/401 |
| 5,323,036 | 6/1994 | Neilson et al. | 257/287 |

FOREIGN PATENT DOCUMENTS

| | | | |
|---|---|---|---|
| 57-52174 | 3/1982 | Japan | 257/284 |
| 1109772 | 4/1989 | Japan . | |
| 1-260861 | 10/1989 | Japan | 257/283 |
| 1-268067 | 10/1989 | Japan | 257/282 |
| 228941 | 1/1990 | Japan . | |
| 2-237040 | 9/1990 | Japan | 257/283 |
| 3-233939 | 10/1991 | Japan | 257/282 |
| 2126785 | 3/1984 | United Kingdom | 257/920 |

Primary Examiner—Jerome Jackson
Assistant Examiner—John Guay
Attorney, Agent, or Firm—Leydig, Voit & Mayer

[57] ABSTRACT

A field effect transistor having a gate electrode in a recess includes a gate electrode and a source electrode in the same recess and a drain electrode outside the recess. Therefore, the gate-to-drain breakdown voltage is increased without increasing the source resistance. A method for producing such an FET includes forming a drain electrode on a semiconductor layer; depositing a first insulating film covering the drain electrode; etching a region of the first insulating film and a portion of the semiconductor layer through an aperture in the first insulating film, thereby producing a recess; depositing a metal film for forming a source electrode and a second insulating film in the recess, thereby forming a source electrode covered by the second insulating film; depositing a third insulating film and anisotropically etching the third insulating film, leaving side walls at the source electrode and the recess; depositing and patterning a gate electrode metal film, thereby forming a gate electrode in an aperture of the third insulating film and in the recess. The gate electrode is formed stably at a prescribed position in the recess and the gate length can be shortened by controlling the thickness of the third insulating film.

3 Claims, 7 Drawing Sheets

FIELD EFFECT TRANSISTOR HAVING GATE AND SOURCE REGIONS IN RECESSES

FIELD OF THE INVENTION

The present invention relates to field effect transistor (hereinafter referred to as FET) and production method therefor and, more particularly, to an FET having a gate electrode in a recess with reduced gate to source capacitance without reduced the gate to drain breakdown voltage.

PRIOR ART

FIGS. 8(a) and 8(b) show a high output FET having integrated a plurality of FETs employing a source electrode and a drain electrode common to adjacent FETs, where FIG. 8(a) is a plan view and FIG. 8(b) is a cross-sectional view taken along line 8b to 8b of FIG. 8(a). In these figures, reference numeral 800 designates a high output FET device in which a plurality of elemental FETs 800a each having a respective gate electrode 9 in each recess 17, are mounted on a GaAs layer 1 on a semi-insulating GaAs substrate 50, employing common source electrodes 2 and drain electrodes 6 for adjacent FETs. Here, reference numeral 9a designates a gate electrode lead wire common to the plurality of the gate electrodes 9.

FIGS. 9(a) and 9(b) show cross-sectional views in major process steps in the production of the high output FET shown in FIG. 8(a). These are cross-sectional views taken along line 8(b)—8(b).

A description is given of the production method of the high output FET in accordance with FIGS. 9(a) and 9(b).

First of all, as shown in FIG. 9(a), an n type GaAs layer 1 is formed on a semi-insulating GaAs substrate 50 by, for example, MBE, and a source electrode 6 and a drain electrode 2 are formed on prescribed regions on the n type GaAs layer 1 by evaporation and lift-off, and then a resist pattern 16 having a resist aperture of prescribed width is produced between the source electrode 6 and the drain electrode 2 by conventional photolithography.

Next, the n type GaAs layer 1 is etched with an etchant comprising a mixture of tartaric acid and hydrogen peroxide to produce a recess, and thereafter, as shown in FIG. 9(b), a gate metal 90 comprising, for example, Ti/Pt/Au is evaporated on the entire surface of the n type GaAs layer 1, and thereafter, unrequired gate metal 90 is removed together with the resist pattern 16, thereby producing a high output FET 800 having the gate electrode 9 comprising the gate metal 90 in the recess 17 shown in FIG. 9(b).

In the prior art high output FET of the above-described construction, because the gate electrode 9 is disposed in the recess 17, the distance between the gate electrode 9 and the drain electrode 2 is lengthened and thereby the gate to drain breakdown voltage can be increased. However, because the distance between the gate electrode 9 and the source electrode 6 is increased, the source resistance unfavorably increases.

Although it is effective to increase the impurity concentration of n type GaAs layer 1 in order to reduce the source resistance, when the impurity concentration of the n type GaAs layer 1 is increased, the gate to drain breakdown voltage is unfavorably reduced.

SUMMARY OF THE INVENTION

It is an object of the present invention to provide an FET having a gate electrode in a recess and a production method therefor that can increase the gate to drain breakdown voltage without increasing the source resistance.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from the detailed description.

According to a first aspect of the present invention, a gate electrode and a source electrode are produced in the same recess, and the drain electrode is produced outside the recess. Therefore, the gate to drain breakdown voltage is increased without increasing the source resistance.

According to a second aspect of the present invention, a production method of an FET includes forming a source electrode with its upper surface covered by an insulating film in a recess in a semiconductor layer, forming insulating films only at a side wall of the source electrode and a side wall of the recess, and self-aligningly forming a gate electrode at an aperture between the insulating films. Therefore, the gate electrode can be formed stably at a prescribed position in the recess as well as the gate length can be shortened by controlling the widths of the insulating films at producing the same.

According to a third aspect of the present invention, in a high output FET including a source electrode and a drain electrode common to adjacent FETs among a plurality of FETs, a source electrode and two gate electrodes arranged adjacent the source electrode are in the same recess, and a drain electrode is outside the recess.

According to a fourth aspect of the present invention, a production method of an FET includes forming a source electrode with its upper surface covered by an insulating film at the center of the respective recess of a plurality of recesses, forming insulating films only at the side walls of the source electrode and at the side walls of the recess itself in the respective recess, and forming a gate electrode in the aperture between the insulating films.

According to a fifth aspect of the present invention, two gate electrodes produced in the same recess of the above-described high output FET are connected to each other via an upward portion of the source electrode without being in contact with the source electrode. Therefore, the gate resistance is reduced.

According to a sixth aspect of the present invention, a second recess shallower than the first recess is located between the recess in which the source electrode and the gate electrode are disposed and the drain electrode is located outside the recess. Therefore, the distance between the gate electrode and the drain electrode is further increased and the gate to drain breakdown voltage is further increased.

According to a seventh aspect of the present invention, a third recess is located in the recess at the source electrode, and a gate electrode is located in the third recess. Therefore, the distance between the gate electrode and the drain electrode is further increased, and the gate to drain breakdown voltage is further increased.

DESCRIPTION OF THE PREFERRED EMBODIMENT

Embodiment 1

Figure 1A:
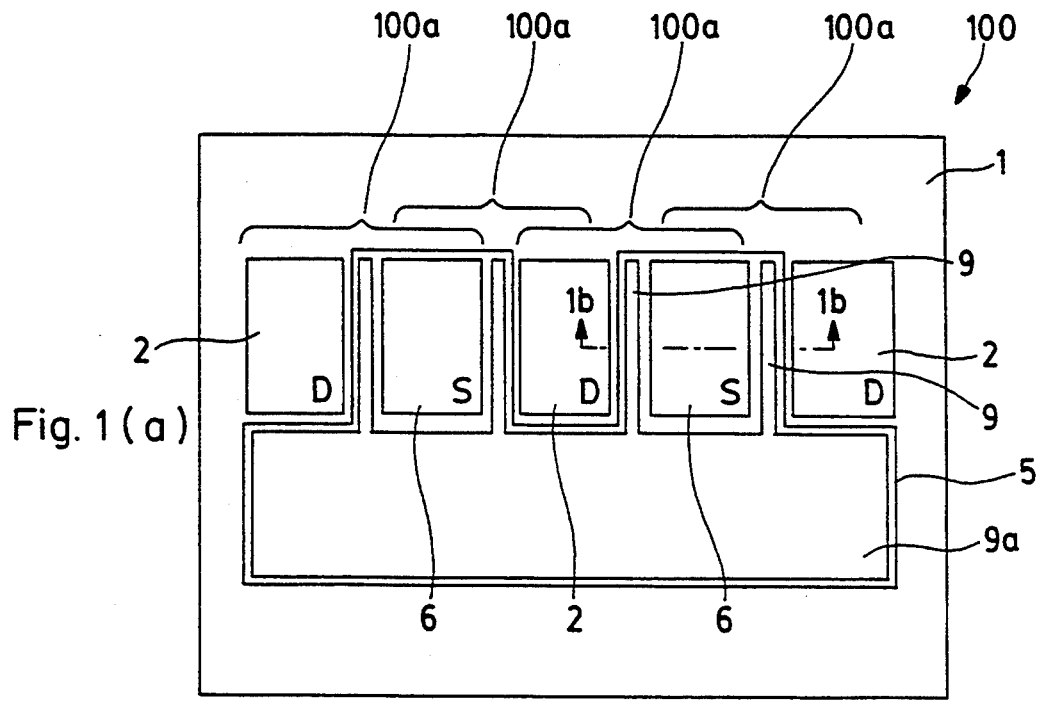
FIG. 1(a) is a plan view of a high output FET according to a first embodiment of the present invention and FIG. 1(b) is a cross-sectional view thereof.
Figure 1B:
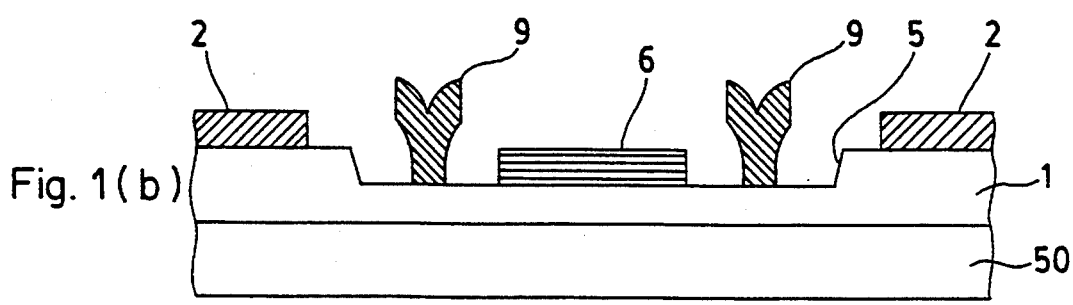
Figure 8A:
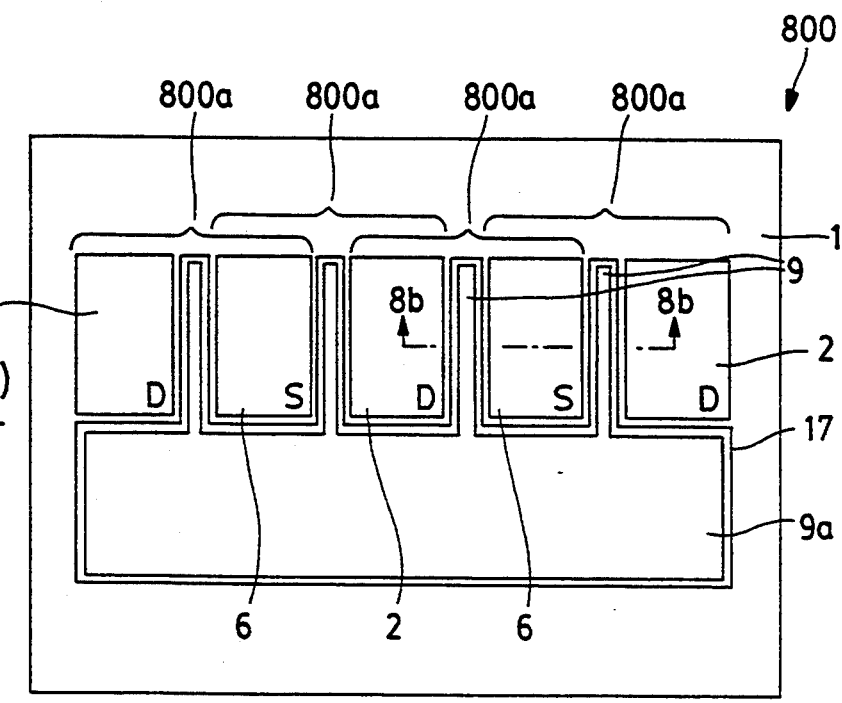
FIGS. 8(a) and 8(b) are a plan view and a cross-sectional view of a prior art high output FET.
Figure 8B:
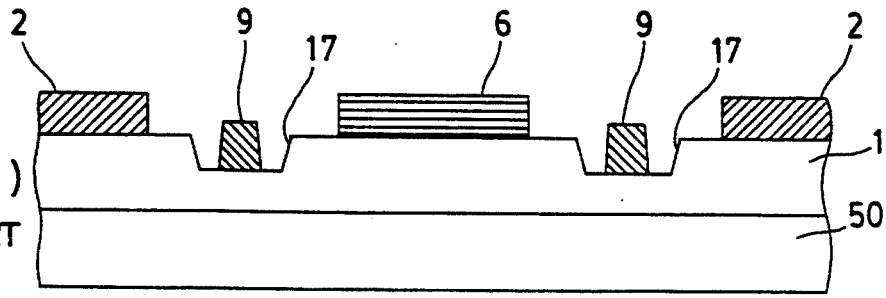
Figure 9A:
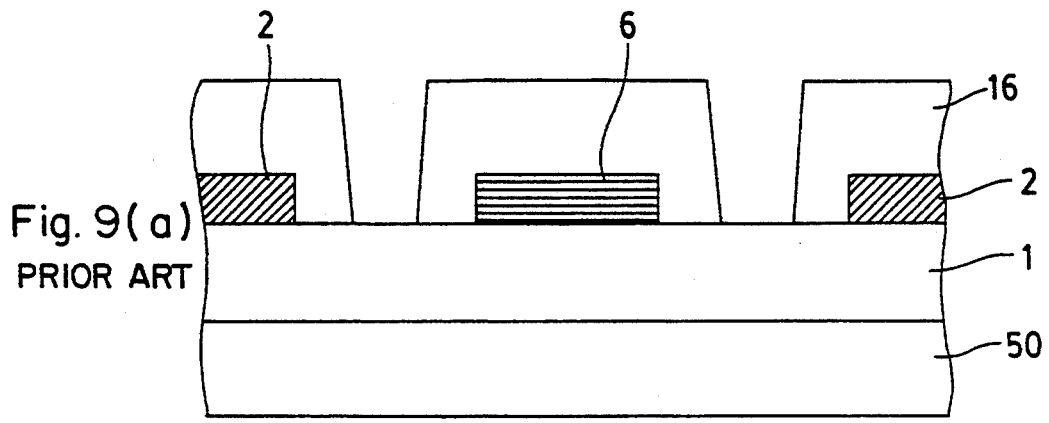
FIGS. 9(a) and 9(b) are cross-sectional views in the major process steps of a method of producing the prior art high output FET.
Figure 9B:
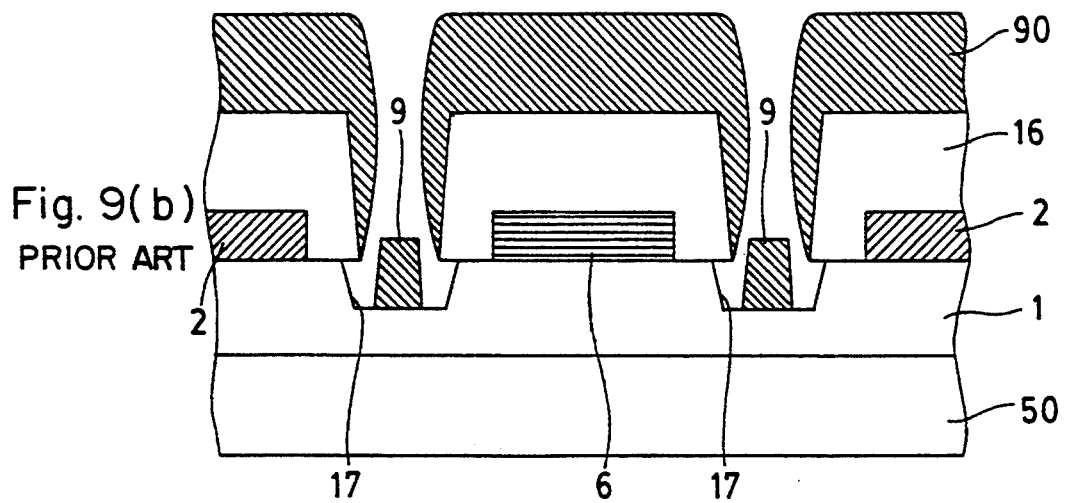

FIGS. 1(a) and 1(b) are diagrams showing a structure of a high output FET including a plurality of FETs employing source electrodes and drain electrodes common to adjacent FETs according to a first embodiment of the present invention, where FIG. 1(a) is a plan view and FIG. 1(b) is a cross-sectional view taken along line 1(b)—1(b) of FIG. 1(a). In the figure, reference numerals used in FIG. 8(a) are used to designate the same or corresponding elements.

Reference numeral 100 designates a high output FET device including a gate electrode 9 and a source electrode 6 are located in a recess 5 on the n type GaAs layer which is disposed on a semi-insulating GaAs substrate 50, and a plurality of FETs 100a having respective drain electrodes 2 located outside the recess 5 employing common source electrodes 2 and the drain electrodes 6 for adjacent FETs. A gate electrode lead wiring 9a is common to the plurality of gate electrodes 9, and wires are bonded to the gate electrode lead wire 9a. The recess 5 is one continuous recess where the gate electrodes 9, the gate electrode lead wiring 9a, and the source electrode 6 are respectively located.

The source electrodes 6 and the drain electrodes 2 are directly connected by bonding wires to the upper surfaces of the source electrodes 6 and the drain electrodes 2. Or, although not shown here, connections may be made by extending the region for forming the recess 5 and forming a source electrode lead common to the plurality of source electrodes 6 in the recess, forming a drain electrode lead common to the plurality of drain electrodes 2 at a region different from the recess 5 on the n type GaAs layer 1, and bonding wires to the source and the drain electrode leads.

FIGS. 2(a)-2(d) show cross-sections in the process steps in the fabrication of a high output FET shown in FIG. 1(a). In the figure, the same reference numerals used in FIG. 1(a) are used to designate the same or corresponding portions. Reference numerals 3, 7, and 8 designate insulating films, and reference numerals 4 and 10 designate resist patterns. FIGS. 2(a)-2(d) show cross-sections taken along line 1b—1b of FIG. 1(a).

A description is given of the production method with reference to FIG. 1(a).

First of all, an n type GaAs layer 1 is formed on a semi-insulating GaAs substrate 50 by MBE (molecular beam epitaxy), and a drain electrode 2 comprising an ohmic-metal film of, for example, an Au alloy series is formed by evaporation and lift-off at a prescribed position on the n type GaAs layer 1. Then, an insulating film 3 comprising an SiN film is deposited on the entire surface by, for example, plasma CVD. Thereafter, an pattern 4 having a resist aperture of a prescribed width at a position opposite a central portion of the insulating film 3 between the drain electrodes 2 is formed by conventional photolithography. Employing this resist pattern 4 as a mask, wet etching, i.e., isotropic etching, using a buffered hydrofluoric acid solution (hereinafter referred to as BHF solution), or a combination of an anisotropic etching using such as RIE and wet isotropic etching using a BHF solution are carried out to side etch the insulating film 3 by a prescribed amount, thereby resulting a state shown in FIG. 2(a).

Next, employing the resist pattern 4 and the insulating film 3 remaining as a mask, the n type GaAs layer 1 is etched with a mixture of tartaric acid and hydrogen peroxide, thereby forming a recess 5. An ohmic metal film of an Au alloy series and an insulating film comprising an SiN film are deposited on the entire surface of the n type GaAs layer 1. Thereafter, the resist pattern 4 is removed, and sintering is performed at about 400°C., thereby producing a source electrode 6 comprising an ohmic metal film with its upper surface covered by an insulating film 7 of SiN.

Figure 2A:
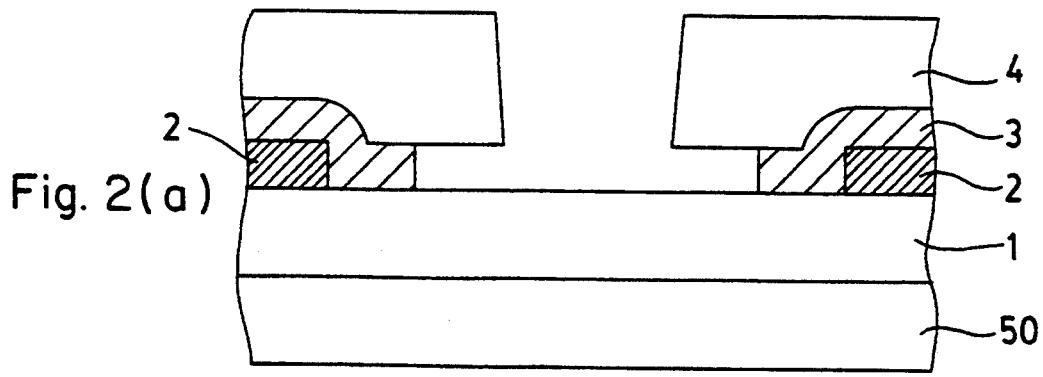
FIGS. 2(a)-2(d) are diagrams illustrating cross-sectional views of major process steps of a method of producing the high output FET of FIG. 1(a).
Figure 2B:
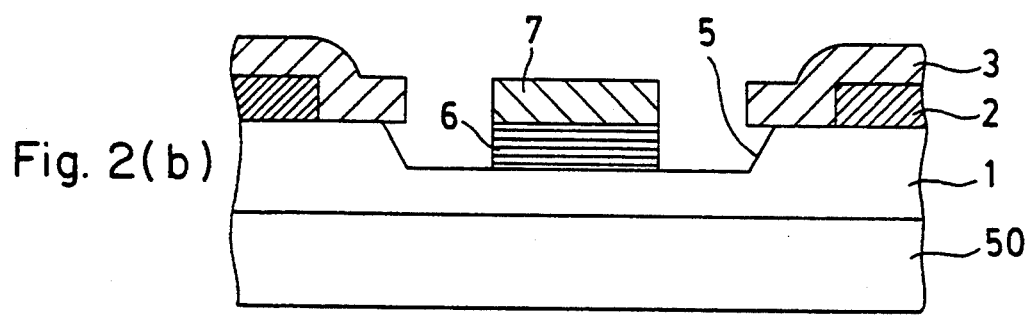
Figure 2C:
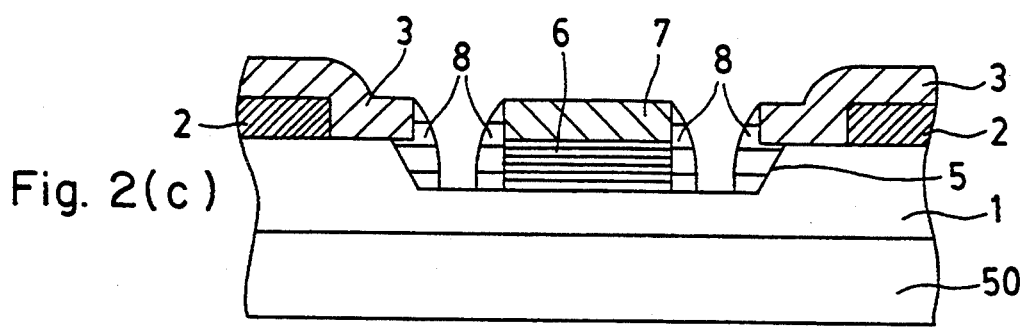

Next, after depositing an insulating film comprising SiN over the entire surface of the n type GaAs substrate 1 by, for example, plasma CVD, an anisotropic etching step such as RIE, is carried out to the entire surface of this insulating film, thereby producing insulating films 8 at the side walls of the source electrode 6 and the insulating film 7 and at the side walls of the recess 5 and the insulating films 3 as shown in FIG. 2(c).

Figure 2D:
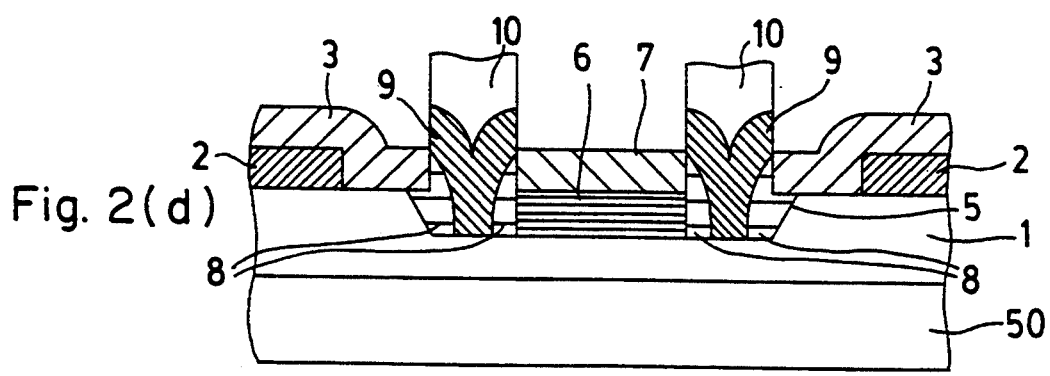

Next, after depositing a gate metal film 9 comprising WSi by sputtering or evaporation over the entire surface of the n type GaAs layer 1, resist pattern 10 is formed only at positions above the portion of the gate metal film 9 between the insulating film 8 by conventional photolithography, and unrequired portions of the gate metal film are removed by RIE employing the resist pattern 10 as a mask, thereby producing gate electrodes 9 at positions spaced a prescribed distance from the source electrode 6 in the recess 5 as shown in FIG. 2(d).

Thereafter, the resist patterns 10 are removed, and the insulating films 3, 7, and 8 are removed by wet etching or dry etching, thereby producing the high output FET 100 shown in FIG. 1(a). Here, the resist pattern 10 is patterned so that the gate bonding pad, i.e., the gate electrode lead wire 9a (refer to FIG. 1(a)) is formed at the same time the gate electrode 9 is formed.

While in the above-described process the insulating films 3, 7, and 8 are removed after the gate electrode 9 is formed, the insulating films 3, 7, and 8 may be left as they are. In this case, contact holes (not shown) are formed in the insulating films 7 and 3, and wires are connected to the upper surfaces of the source electrode 6 and the drain electrode 2 through the contact holes.

In the high output FET of this first embodiment, the gate electrode 9 and the source electrode 6 are located in the recess 5, and the drain electrode 2 is located outside the recess 5. Therefore the interval between the gate electrode 9 and the drain electrode 2 is lengthened, thereby enhancing the gate to drain breakdown voltage. Furthermore, the gate electrode 9 and the source electrode 6 are located on the bottom surface of the same recess, and the gate to source resistance is reduced with relative to the prior art device, thereby enhancing the high frequency characteristics of the device. In addition, the gate electrodes 9 are produced self-aligningly with the source electrode 6 through the apertures between the insulating films 8 along the side walls of the source electrode 6 and the side walls of recess 5, and therefore, the gate electrodes 9 is formed stably at positions spaced a prescribed distance from the source electrode 6 in the recess 5, whereby the reliability of the device is enhanced relative to the prior art device. Additionally, by controlling the width of the insulating films 8 at the side walls of the source electrode 6 and at the side walls of the recess 5 when forming the insulating films 8, shortening of the gate length is achieved.

Embodiment 2

Figure 3A:
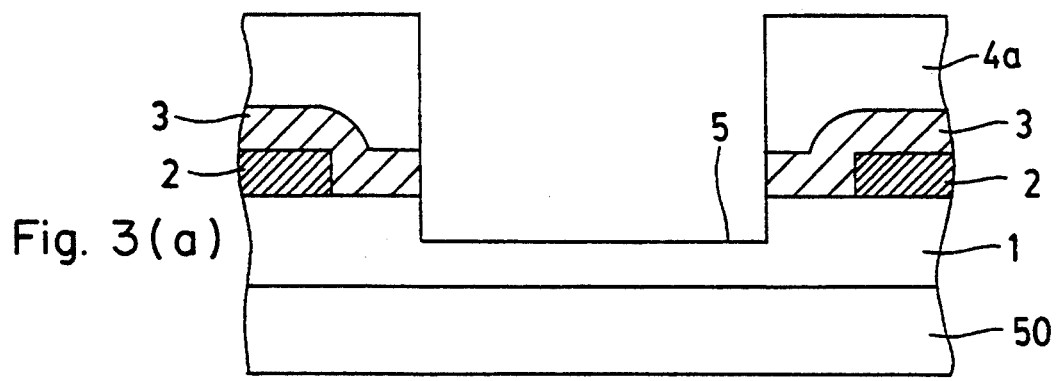
FIGS. 3(a)-3(c) are diagrams illustrating cross-sectional views of major process steps of a method of producing a high output FET according to a second embodiment of the present invention.
Figure 3B:
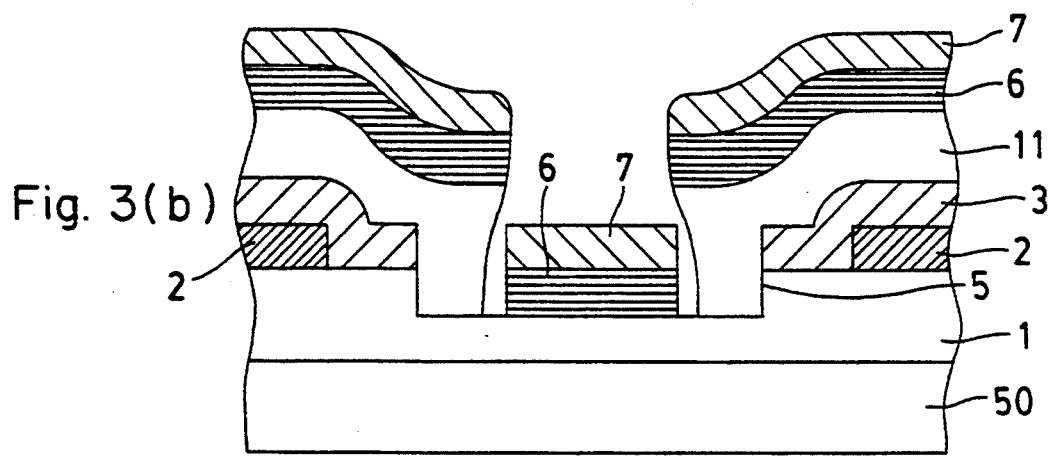
Figure 3C:
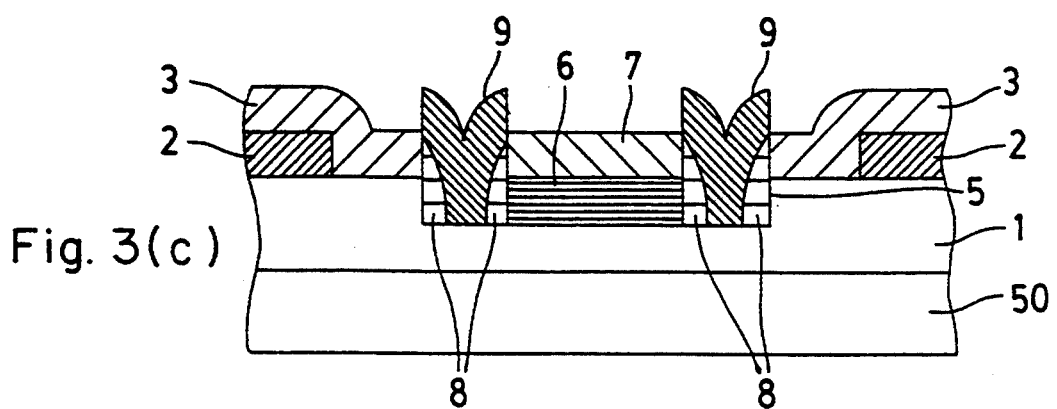

FIGS. 3(a)–3(c) are diagrams showing cross-sections in the steps in the fabrication process of a high output FET that has a plurality of FETs employing common source electrodes and drain electrodes for adjacent FETs according to a second embodiment of the present invention. In the figures, the reference numerals used in FIGS. 1(a) and 2(a) are used to designate the same or corresponding elements. The whole construction of the high output FET obtained by this fabrication process is fundamentally the same as that of the first embodiment.

A description is given of the fabrication method of this FET with reference to FIGS. 3(a)–3(c).

First of all, an n type GaAs layer 1 is produced on a semi-insulating GaAs substrate 50 by CVD or the like, and a drain electrode 2 comprising an ohmic-metal film of, for example, an Au alloy formed by evaporation and lift-off at a prescribed position on the n type GaAs layer 1. Thereafter, an insulating film 3 comprising an SiN film is deposited on the entire surface by, for example, plasma CVD. Thereafter, an pattern 4a having a resist aperture regulating the width of a recess to be formed is formed at a position opposite the central portion of the region of the insulating film 3 between the drain electrodes 2 by conventional photolithography, and thereafter, employing this resist pattern 4a as a mask, an etching is carried out by RIE to remove the insulating film 3 and an upper layer portion of the n type GaAs layer 1, thereby producing a recess 5, as shown in FIG. 3(a).

Next, after the resist pattern 4a is removed, a resist pattern 11 having an aperture of a prescribed width is produced at the central portion of the recess 5 by conventional photolithography, and thereafter, an ohmic metal film 6 and an insulating film 7 are deposited on the entire surface of the n type GaAs layer 1, resulting a state as shown in FIG. 3(b). Thereafter, unrequired ohmic metal film 6 and insulating film 7 are removed with the resist pattern 11, and sintering is carried out at about 400° C., whereby a source electrode 6 with its upper surface covered by the insulating film 7 is formed.

Next, as shown in FIG. 3(c), insulating films 8 are formed along the side walls of the source electrode 6 and the side walls of the recess 5 and thereafter, gate electrodes 9 are formed through the aperture surrounded by insulating films 8.

By the fabrication process of this second embodiment, a high output FET which, having the gate electrode 9 and the source electrode 6 in the recess 5 and the drain electrode 2 outside the recess 5, has a high gate to drain breakdown voltage and a reduced gate to source resistance is produced as in the first embodiment. In addition, although the number of the photolithography process increases by one relative to the fabrication process of the first embodiment, the width of the recess 5 is determined by the width of the resist aperture of the resist pattern 4a, thereby enhancing the dimensional precision of the width of the recess 5. As a result, the gate length and the interval between the gate electrode and the drain electrode can be controlled to a prescribed dimension at high precision, thereby enhancing the reliability of the device.

Embodiment 3

Figure 4:
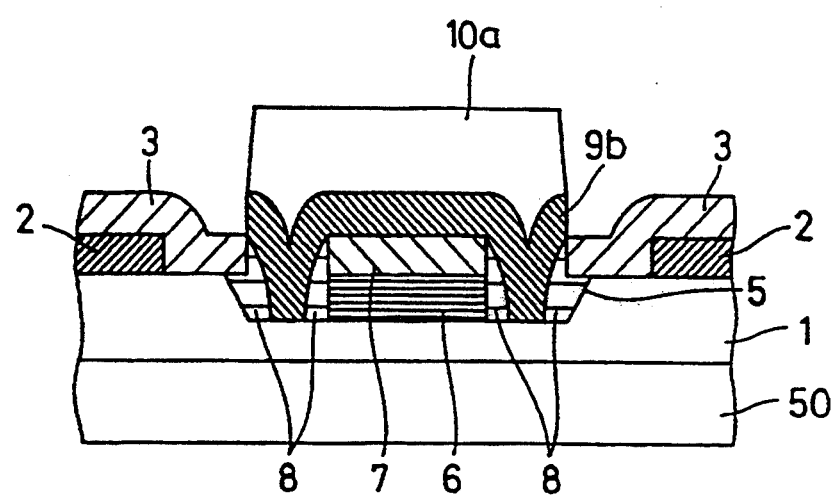
FIG. 4 is a cross-sectional view of major process step of a method of producing a high output FET according to a third embodiment of the present invention.

FIG. 4 shows a cross-section on a major process step in the fabrication process of a high output FET that has a plurality of FETs employing a common source electrode and a drain electrode of adjacent FETs according to a third embodiment of the present invention. In the figure, the same reference numerals as those used in FIGS. 1(a) and 3(a) are used to designate the same or corresponding elements. Reference numeral 9b designates a gate electrode and reference numeral 10a designates a resist pattern.

Figure 5:
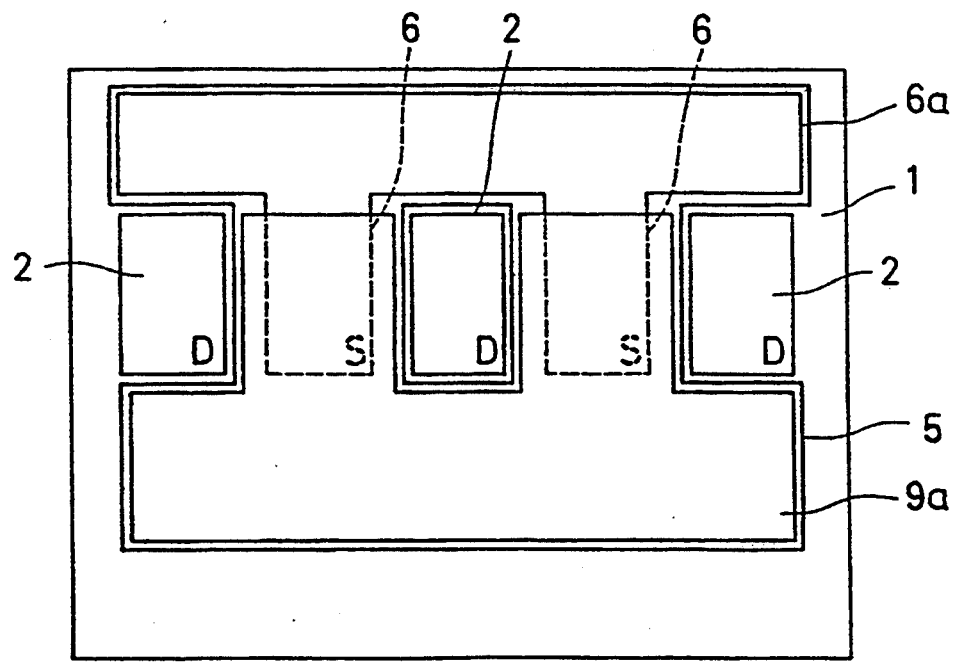
FIG. 5 is a plan view illustrating a structure of a high output FET according to a third embodiment of the present invention.

The fabrication process of this third embodiment is obtained by replacing the process shown in FIG. 2(d) by the process shown in FIG. 4 and forming the resist pattern 10a covering the source electrode 6, whereby the gate electrode 9b straddles the source electrode 6 in one recess 5. FIG. 5 shows a plan view of a high output FET fabricated in this way. In this high output FET, the source electrode 6 is covered by the gate electrode 9, and it is difficult to connect the wiring at the upper surface of the source electrode 6 and, therefore, the region for forming the recess 5 is extended when forming the recess 5, and the source electrode lead 6a connecting to the source electrode 6 is produced in the recess 5 when forming the source electrode 6.

In the high output FET of this third embodiment, the same effects as in the first embodiment are obtained, and further the gate resistance can be reduced and the high frequency characteristics can be further enhanced relative to the first and the second embodiments.

Here, if a low resistance metal layer is separately formed on the gate electrode 9b, the gate resistance can be reduced, and if the insulating film 7 on the source electrode 6 is removed by wet etching after the gate electrode is formed, the gate to source capacitance can be reduced.

Embodiment 4

Figure 6:
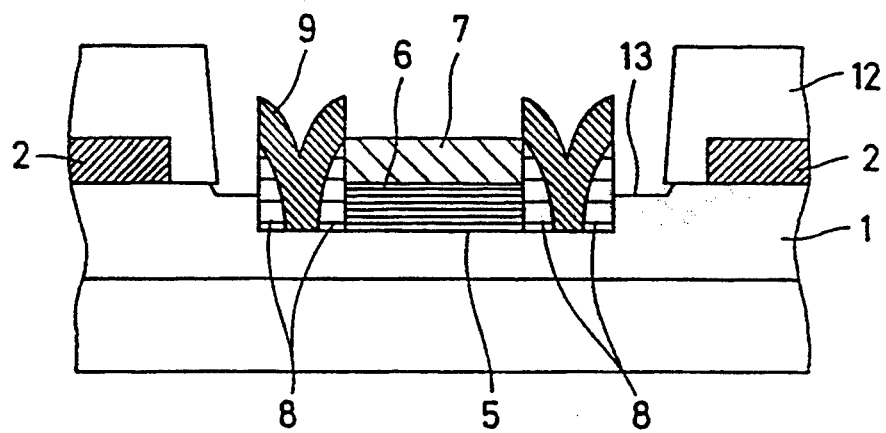
FIG. 6 is a cross-sectional view illustrating a main process of a method of producing a high output FET according to a fourth embodiment of the present invention.

FIG. 6 shows a cross-section in a process step in the fabrication process of a high output FET that has a plurality of FETs employing common source electrodes and a drain electrodes of adjacent FETs according to a fourth embodiment of the present invention. In the figure, the reference numerals used in FIG. 1(a)

designate the same or corresponding elements. Reference numeral 12 designates a resist pattern.

In the fabrication process of this fourth embodiment, after producing a source electrode 6 and gate electrodes 9 in the recess 5 as in the first and second embodiments, the insulating film 3 positioned between the gate electrodes 9 and the drain electrodes 2 is selectively removed by wet etching or dry etching as shown in FIG. 6. A resist pattern 12 having an aperture edge a prescribed distance from the end of the recess 5 is formed by conventional photolithography, and a recess 13 of a depth shallower than the recess 5 is formed by wet etching employing the resist pattern 12 as a mask.

In the high output FET that is thus produced, the interval between the gate electrodes 9 and the drain electrodes 2 can be further lengthened relative to the first to the third embodiments, and the gate to drain breakdown voltage can be further increased.

Embodiment 5

Figure 7:
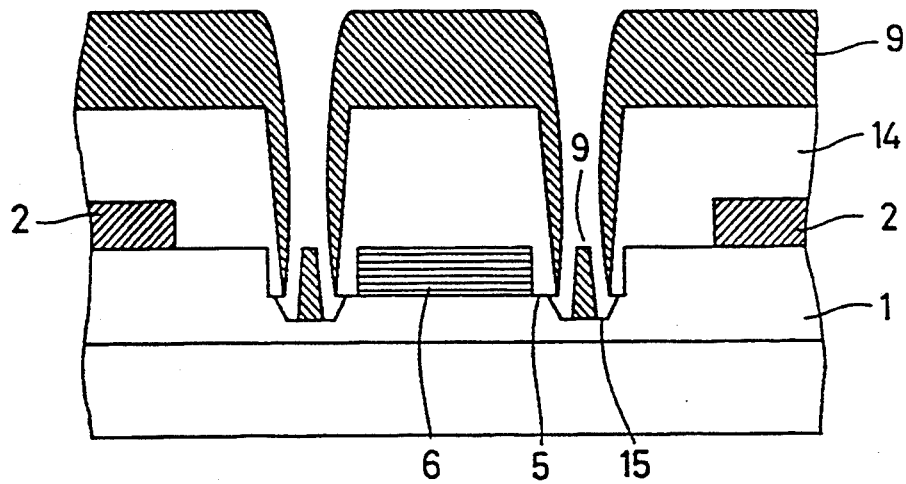
FIG. 7 is a cross-sectional view illustrating a main process step in a method of producing a high output FET according to a fifth embodiment of the present invention.

FIG. 7 shows a cross-section in a major process step in the fabrication process of a high output FET that has a plurality of FETs employing common source electrodes and drain electrodes of adjacent FETs according to a fifth embodiment of the present invention. In the figure, the reference numerals used in FIG. 1(a) are used to designate the same or corresponding elements.

The fabrication process of this fifth embodiment includes, after forming a source electrode 6 in the recess 5 as in the first and second embodiments, forming a resist pattern 14 having an aperture between the source electrode in the recess 5 and the side wall of the recess, forming a recess 15 in the recess 5 by wet etching employing a mixture of tartaric acid and hydrogen peroxide as an etchant using the resist pattern 14 as a mask and, thereafter, depositing gate metal 90 by evaporation, thereby forming a gate electrode 9 in the recess 15.

In the high output FET of this fifth embodiment thus produced, the distance between the gate electrode 9 and the drain electrode 2 is further lengthened relative to the first to third embodiments as in the fourth embodiment, whereby the gate to drain breakdown voltage is further increased. Heretofore, because the interval between the source electrodes and the drain electrodes is further lengthened, the gate to source resistance is a little increased.

While in this embodiment the gate electrode 9 is formed after the recess 15 is formed, when the gate electrode 9 is formed without forming a recess 15, the high output FET obtained then becomes that of the same structure as the first and the second embodiments.

While the above-described embodiments have a plurality of FETs, the present invention may be applied to a conventional FET having a gate electrode, a source electrode, and a drain electrode.

According to a first embodiment of the present invention, a gate electrode and a source electrode are located in the same recess, and a drain electrode is located outside the recess. Therefore, the gate to drain breakdown voltage can be increased without increasing the source resistance.

According to a second embodiment of the present invention, a production method includes forming a source electrode with its upper surface covered by an insulating film in a recess in a semiconductor layer, an insulating film is formed only at a side wall of the source electrode and a side wall of the recess, and a gate electrode is self-aligningly formed at an aperture between the insulating films. Therefore, the gate electrode can be formed stably at a prescribed position in the recess as well as the gate length can be shortened by controlling the width when producing the insulating film.

According to a third embodiment of the present invention, in a high output FET including a common source electrode and a drain electrode for adjacent FETs in a plurality of FETs, a source electrode and two gate electrodes arranged adjacent the source electrode are located in the same recess, and a drain electrode is located outside the recess.

According to a fourth embodiment of the present invention, a production method includes forming a source electrode with its upper surface covered by an insulating film at the center part of a respective recess of a plurality of recesses, forming insulating films only at the side walls of the source electrodes and the side walls of the recess itself in respective recesses, and forming a gate electrode in the aperture between the insulating films.

According to a fifth embodiment of the present invention, two gate electrodes the same recess of the above-described high output FET are connected to each other above the source electrode without electrically contacting the source electrode. Therefore, the gate resistance is reduced.

According to a sixth embodiment of the present invention, a second recess deeper than the first recess is located between the recess in which the source electrode and the gate electrode are located, and the drain electrode is formed outside the recess. Therefore, the distance between the gate electrode and the drain electrode is further lengthened and the gate to drain breakdown voltage is further increased.

According to a seventh embodiment of the present invention, a third recess is formed in the recess where the source electrode is located, and a gate electrode is disposed in the third recess. Therefore, the distance between the gate electrode and the drain electrode is further increased, and the gate to drain breakdown voltage is further increased.

What is claimed is:

1. A field effect transistor comprising:
   a substrate having a first recess and a second recess shallower than the first recess and surrounding the first recess;
   two gate electrodes and a source electrode disposed on the substrate in the first recess, the source electrode being disposed between and spaced from the two gate electrodes; and
   two drain electrodes disposed on the substrate outside of the first recess, the two gate electrodes being disposed between the two drain electrodes.

2. A field effect transistor comprising:
   a substrate having a first recess and a second recess within the first recess;
   two gate electrodes and a source electrode disposed on the substrate in the first recess, the gate electrodes being disposed in the second recess and the source electrode being disposed between and spaced from the two gate electrodes; and
   two drain electrodes disposed on the substrate outside of the first recess, the two gate electrodes being disposed between the two drain electrodes.

3. A high power output field effect transistor including a plurality of field effect transistors comprising:
   a semiconductor substrate having a plurality of first, spaced apart recesses and a plurality of second recesses shallower than the first recesses, each second recess surrounding a respective first recess;

a plurality of source and drain electrodes alternatingly arranged on said substrate, each of said source electrodes being disposed in a respective first recess; and a pair of gate electrodes disposed in each of the first recesses, the gate electrodes in each first recess being disposed on opposite sides of the source electrode in the respective first recess.

* * * * *